(12) United States Patent
Brown et al.

(10) Patent No.: US 6,531,700 B1
(45) Date of Patent: Mar. 11, 2003

(54) INTEGRAL CHARGE WELL FOR QWIP FPA'S

(75) Inventors: Kevin Brown, Clermont, FL (US); Robert J. Martin, Orlando, FL (US); Peter J. Falter, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/666,829

(22) Filed: Sep. 21, 2000

Related U.S. Application Data (63) Continuation-in-part of application No. 09/149,483, filed on Sep. 8, 1998, now Pat. No. 6,198,101.

(51) Int. Cl.$^7$ ................................................ H01L 27/14
(52) U.S. Cl. ................................ 250/338.4; 250/370.01
(58) Field of Search ......................... 250/338.4, 370.01, 250/370.08, 332; 327/515

(56) References Cited

U.S. PATENT DOCUMENTS

| | | | | |
|---|---|---|---|---|
| 3,913,095 | A | * 10/1975 | Dlugos | ....................... 340/347 |
| 4,331,889 | A | * 5/1982 | Parrish | ....................... 307/311 |
| 4,681,440 | A | * 7/1987 | Burke et al. | ................. 356/218 |
| 4,903,101 | A | 2/1990 | Maserjian | |
| 4,956,686 | A | 9/1990 | Borrello et al. | |
| 5,013,918 | A | 5/1991 | Choi | |
| 5,047,822 | A | 9/1991 | Little, Jr. et al. | |
| 5,198,659 | A | 3/1993 | Smith et al. | |
| 5,300,780 | A | 4/1994 | Denney et al. | |
| 5,355,000 | A | 10/1994 | Delacourt et al. | |
| 5,384,469 | A | 1/1995 | Choi | |
| 5,488,504 | A | 1/1996 | Worchesky et al. | |
| 5,539,206 | A | 7/1996 | Schimert | |
| 5,629,522 | A | * 5/1997 | Martin et al. | ............ 250/338.4 |
| 5,965,899 | A | 10/1999 | Little, Jr. | |
| 6,163,395 | A | * 12/2000 | Nemecek et al. | ........... 359/187 |

OTHER PUBLICATIONS

W.A. Beck, et al., "Imaging Performance of 256×256 LWIR Miniband Transport Multiple Quantum Well Focal Plane Arrays", pp. 1–14, Proc. Second Int. Symp. 2–20 μm Wavelength Infrared Dets. and Arrays: Phys. and Appl., Oct. 10–12, 1994, Miami Beach, Florida.

Lester J. Kozlowski, et al., "LWIR 128×128 GaAs/AIGaAs Multiple Quantum Well Hybrid Focal Plane Array", IEEE Translation on Electron Devices, vol. 38, No. 5, May 1991, pp. 1124–1130.

A Köck, et al., "Double Wavelength Selective GaAs/AIGaAs Infrared Detector Device", Applied Physics Letters 60(16), Apr. 20, 1992, pp. 2011–2013.

I. Gravé, et al., Voltage–Controlled Tunable GaAs/AIGaAs Multistack Quantum Well Infrared Detector, Applied Physics Letters 60 (19), May 11, 1992, pp. 2362–2364.

E. Martinet, et al., Switchable Bicolor (5.5–9.0 μm) Infrared Detector Using Asymmetrc GaAs/AIGaAs Multiquantum Well, Applied Physics Letters 61(3), Jul. 20, 1992, pp. 246–248.

K. Kheng, et al., "Two–Color GaAs/(AIGa)As Quantum Well Infrared Detector With Voltage–Turnable Spectral Sensitivity At 3–5 and 8–12 μm", Applied Physics Letters 61(6), Aug. 10, 1992, pp. 666–668.

K.L. Tsai, et al., "Two–Color Infrared Photodetector Using GaAs/AIGaAs and Strained InGaAs/AIGaAs Multiquantum Wells", Applied Physics Letters 62 (26, Jun. 28, 1993, pp. 3504–3506.

(List continued on next page.)

Primary Examiner—Constantine Hannaher
Assistant Examiner—Otilia Gabor
(74) Attorney, Agent, or Firm—Burns, Doane, Swecker & Mathis, LLP (57) ABSTRACT

A quantum well infrared photodetector includes a direct connection between the charge well and detector that induces a nonlinear dynamic bias. This dynamic bias advantageously corrects for nonuniformity in the conductance of the detector.

5 Claims, 7 Drawing Sheets

OTHER PUBLICATIONS

B.F. Levine, "Quantum–Well Infrared Photodetectors", Jornal of Applied Physics 74 (8), Oct. 15, 1993, pp. 1–87.

C.G. Bethea, et al., "Long Wavelength Infrared 128×128 $Al_xGa_{1-x}As$/GaAs Quantum Well Infrared Camera and Imaging System", IEEE Transactions on Electron Devices, vol. 40, No. 11, Nov. 1993, pp. 1957–1963.

G. Sarusi, et al., "Improved Performance of Quantum Well Infrared Photodetectors Using Random Scattering Optical Coupling", Applied Physics Letters 64 (8), Feb. 21, 1994, pp. 960–962.

Y.H. Wang, et al., "A GaAs/AIGaAs and GaAs/AIGaAs Stacked Quantum Well Infrared Photodetector For 3–5 and 8–14 $\mu$m Detection", Journal of Applied Physics 76(4), Aug. 15, 1994, pp. 2538–2540.

M.Z. Tidrow, et al., "Grating Coupled Multicolor Quantum Well Infrared Photodetectors", Applied Physics Letters 67 (13), Sep. 25, 1995, pp. 1800–1802.

C.J. Chen, et al., Corrugated Quantum Well Infrared Photodetectors For Normal Incident Light Coupling, Applied Physics Letter 68 (11), Mar. 11, 1996, pp. 1446–1448.

T.R. Schimert, et al., "Enhanced Quantum Well Infrared Photodetor With Novel Multiple Quantum Well Grating Structure", Applied Physics Letters 68 (20), May 13, 1996, pp. 2846–2848.

* cited by examiner

INTEGRAL CHARGE WELL FOR QWIP FPA'S

The present application is a continuation-in-part of application Ser. No. 09/149,483, now U.S. Pat. No. 6,198,101 filed on Sep. 8, 1998.

BACKGROUND

Quantum Well Infrared Photodetector Focal Plane Arrays (QWIP FPA's) are conventionally used for infrared detection and imaging. Typical applications of QWIP FPA's include fiber optics communications systems, temperature sensing, night vision, eye-safe range finding, and process control. As is known in the art, QWIP FPA's are composed of arrays of detector structures, wherein each detector structure produces a signal that is transmitted through a conductor bump to an external Read Out Integrated Circuit (ROIC) unit cell. The outputs of the plurality of ROIC unit cells associated with each detector in the array produce an integrated representation of the signal from the detector. To produce this output signal, a fixed bias is applied to the detector and the detector photocurrent resulting from the bias and the incident radiation is integrated. This integration function is performed by an integration charge well (integration capacitor) that is disposed within each individual ROIC unit cell. The combined integrated outputs of the plurality of ROIC unit cells in the array produce an image corresponding to the received infrared radiation.

Figure 1:
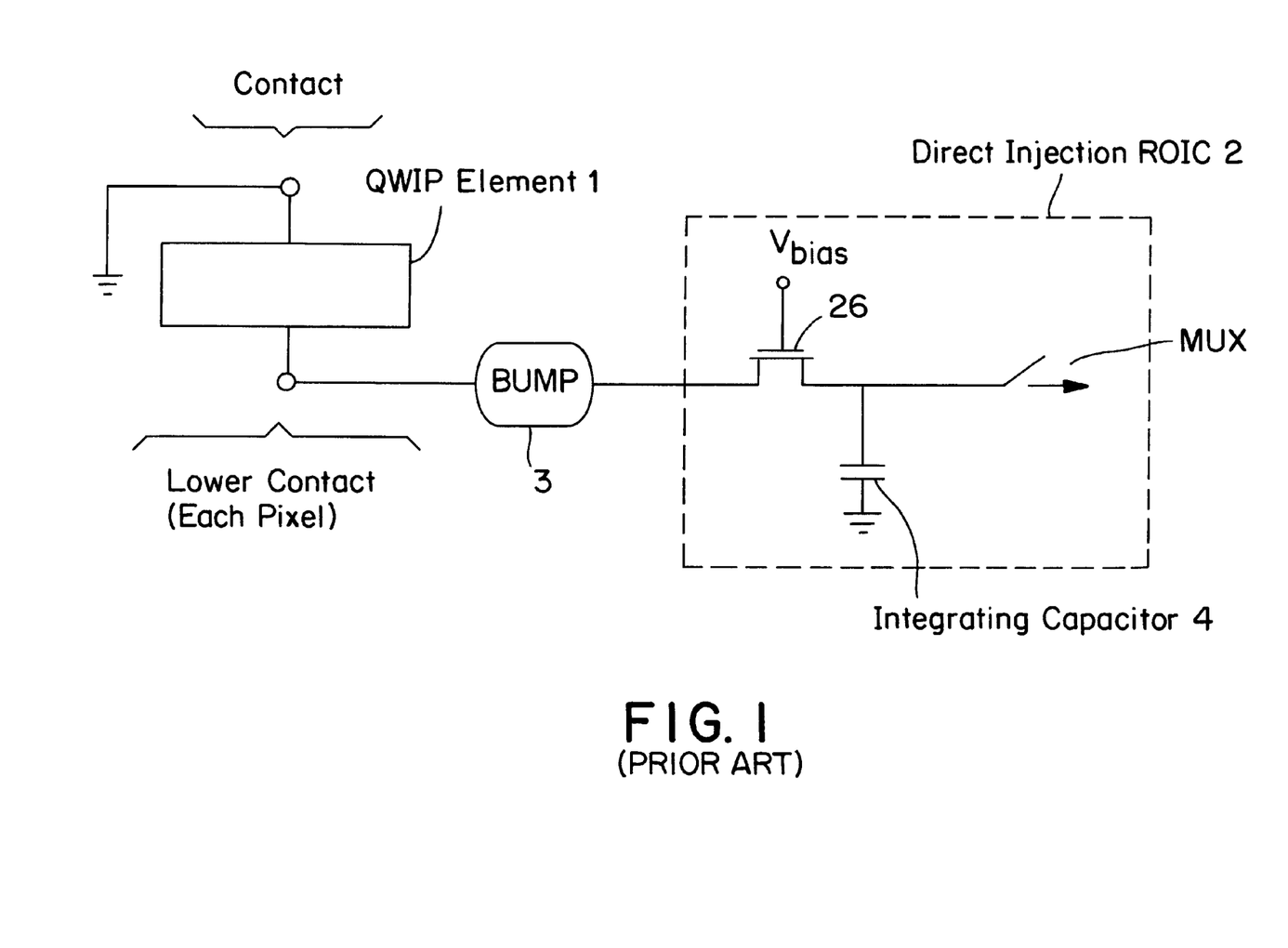
FIG. 1 is a schematic diagram of a prior art quantum well detector that includes the integrating capacitor physically disposed on the Read Out Integrated Circuit unit cell.

As shown in FIG. 1, a conventional photodetector architecture consists of the detector structure 1 physically separated from the ROIC unit cell structure 2 and electrically connected through a conductive bump 3. In this prior art photodetector architecture the integrating capacitor 4 (unit cell charge well) is physically disposed within the ROIC unit cell itself. The usable area of the ROIC unit cell is constrained by the pitch of the overlying detector in the array. This constraint on the usable area further limits the size of the charge well which is the largest component in the unit cell. As the pitch of each detector in the array is reduced to create greater detector density, the usable area of the associated unit cell must also be reduced. This reduction limits the size of the charge well and, ultimately, places limits on the density of the detector array.

To produce very high density (for example 856×480 or 1024×576) QWIP Focal Plane Arrays the detector pitch may need to be reduced to less than 18 $\mu$m. As already noted, this small pitch will limit the usable area for the unit cell charge well and also any additional unit cell storage well capacitors. Even with the use of 0.5 $\mu$m or 0.35 $\mu$m technology the available area for these capacitors in the unit cell will be very small. Additionally, there is a need to place smart focal plane array functions into the ROIC but in conventional designs, the small pitch limits the space that is available to provide these functions. Thus, the conventional photodetector architecture, in which the unit cell contains all of the components except the detector, imposes a limitation on the size and functionality of the unit cell charge well and the density of the FPA.

An additional drawback of the prior art concerns the inherent variation in the conductivities of each of the detectors in a focal plane array. These variations in conductivity result in detector elements that have different responsivities to incident radiation (e.g., high responsivity/"hot" or low responsivity/"cold" detector pixels). Variation in responsivity among the detectors across the array disadvantageously leads to nonuniform array imagery. However, the ROIC circuitry of the prior art fails to provide any compensation for this variation in responsivity. The conventional photodetector of FIG. 1 includes a ROIC injection transistor 26 that is used to bias the detector element 1. This transistor functions to provide a constant bias voltage that produces a linear response from the detector element 1. Since the detector's responsivity is also a function of the applied bias voltage, the fixed bias provided by the prior art injection transistor 26 does not compensate for the variation in responsivity due to inherent variations in detector conductivity.

Another drawback of the prior art concerns the use of QWIP FPA's as infrared target searching and tracking sensors. Such sensors are often required to possess low Noise Equivalence Irradiance (NEI) to distinguish faint targets near the background irradiance levels and high instantaneous dynamic range to prevent saturation while tracking intense targets. Conventional approaches to this problem include using automatic gain control (AGC) or increasing the charge well size and the detector's A/D resolution. AGC solutions are appropriate when merely considering a single infrared target. Using AGC, the sensor initially can be operated in a high gain mode to acquire the target. As the infrared target grows in intensity, the sensor gain is reduced to prevent saturation. Use of AGC to change system gain, however, has the consequence that, if the system gain is adjusted to accomodate a high intensity IR target, the system sensitivity will be decreased such that other low intensity targets may not be acquired. In a specific application such as missile warning, this inability to acquire multiple targets is unacceptable.

Other conventional approaches to this problem include the use of larger charge wells and adding bits to the sensor A/D converter. Future sensors will, however, increasingly require multi-color, high resolution detectors. Such sensors will thus require small unit cell sizes and more complex ROICs. Charge well size will therefore eventually be constrained by space limitations. Additionally, the resolution of the sensor's receiving electronics will likely be limited to 14 bits based on a number of factors including required data rates, the desire for a minimum number of outputs per channel, and component availability.

SUMMARY

It would thus be desirable to provide an improved quantum well photodetector that provides solutions to the above identified problems, including an improved dynamic range for detecting multiple IR targets over a wide range of target irradiance. An additional aspect of the invention also provides for correction in the responsivity of the detector due to inherent variations in detector conductivity. This is accomplished by providing dynamic detector biasing. One way of doing this is by coupling the charge well to the detector. Another aspect of the invention consists of an improved detector structure where the charge well is fabricated on the detector itself. Fabricating the charge well on the detector structure may be accomplished by, for example, adding an extra contact layer and a dielectric layer to a standard quantum well such as a multiple quantum well. In one embodiment the added contact layer is composed of doped GaAs and the dielectric layer is composed of undoped GaAs. The dielectric layer can alternatively be constructed of other materials such as SiO, $SiO_2$, ZnS, or $MgF_2$. Fabricating the charge well on the detector structure permits a larger charge well as compared to the prior art and further permits configuration of the detector in a very high density focal plane array.

BRIEF DESCRIPTION OF THE DRAWINGS

The objects and advantages of the invention will be understood by reading the following detailed description in conjunction with the drawings in which.

DETAILED DESCRIPTION

In accordance with one aspect of the invention, compensation for variations in detector responsivity is provided by dynamically biasing each detector element with a voltage derived from the voltage across the detector's corresponding charge well. In one embodiment, shown in FIG. 2, this is accomplished by providing a direct connection between the charge well capacitance and the detector output without the presence of any intervening direct injection transistor 26 (see FIG. 1). It will be recognized by those having ordinary skill in the art, that alternative embodiments may include one or more intervening elements between the charge well capacitance and the detector output, so long as the biasing voltage for the detector is primarily derived from the voltage across the charge well capacitance.

Figure 2:
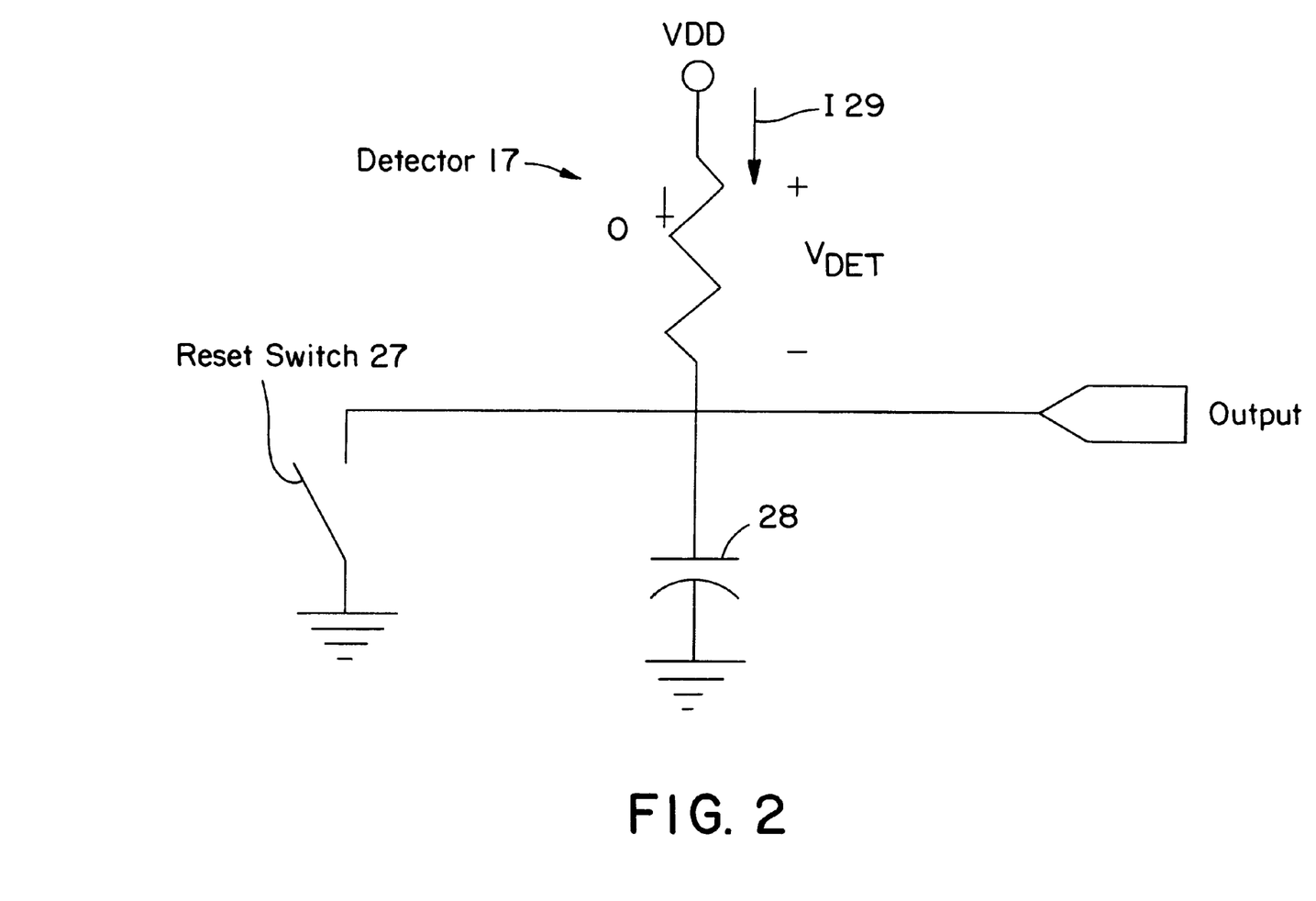
FIG. 2 is a schematic diagram of an aspect of the invention where the charge well is directly coupled to the detector.

Unlike the prior art fixed bias mode, the detector bias voltage ($V_{DET}$) in this exemplary embodiment changes as a function of the charge well voltage. Inspecting the detector photo-current 29 using a narrow band flux approximation yields:

$$i(T) = \tau_o \Omega A_d \eta g q \Phi e^{\left(\frac{-T_p}{T}\right)} \text{ amperes} \quad \text{Eqn. (1)}$$

where:

$\tau_0$ is the optical transmission efficiency,
$\Omega$ is the optical solid viewing angle,
$A_d$ is the pitch area of the detector in cm$^2$,
$\eta$ is the detector quantum efficiency,
g is the photoconductive gain,
q is the electron charge (1.6*10$^{-19}$ coulombs),
$\Phi_p$ is the peak flux in photons/second/cm$^2$/steradian,
$T_p$ is the peak temperature in Kelvin, and
i(T) is the photocurrent in amperes.

Let $$K_p = \tau_0 \Omega A_d \eta q \Phi_p \quad \text{Eqn. (2)}$$

then $$i(T) = K_p g e^{\left(\frac{-T_p}{T}\right)} \text{ amperes} \quad \text{Eqn. (3)}$$

The detector thus looks like a photoconductor with photoconductive gain $$g = \frac{\mu_c \tau_c V_{DET}}{t_d^2} \quad \text{Eqn. (4)}$$

where, $t_d$=total super lattice well thickness in centimeters
$\tau_c$=carrier lifetime in seconds
$\mu_c$=carrier mobility in cm$^2$/(volt*second)
$V_{DET}$=detector bias voltage in volts The detector resistance $R_d$ is then $$R_d = \frac{t_d}{\mu_c \tau_c K_p e^{\left(\frac{-T_p}{T}\right)}} \text{ ohms} \quad \text{Eqn. (5)}$$

and the detector conductance G is therefore $$G = 1/R_d = \frac{\mu_c \tau_c K_p e^{\left(\frac{-T_p}{T}\right)}}{t_d} \text{ siemens} \quad \text{Eqn. (6)}$$

In the circuit of FIG. 2, the change in detector bias $V_{DET}$ occurs during operation of the detector when the reset switch 27 is activated to dump the charge accumulated for the previous video frame. The new frame image is collected by charging the well capacitance 28 for a specified time. The time response for the voltage across the charge well in the circuit configuration of FIG. 2 is:

$$V_{OUT}(t) = V_{DD}(1 - e^{-Gt/C}) \text{ volts} \quad \text{Eqn. (7)}$$

where t is the integration period
C is the charge well capacitance
G is the quantum well photo conductance The bias applied across the detector 17 is therefore a nonlinear exponential voltage. This nonlinear response can be advantageous since it provides a higher bias to low conductance detector elements, and a lower bias to high conductance detector elements. This can be demonstrated by considering the nominal detector conductivity G with a variation of g:

$$G_{max} = G + g \text{ siemens} \quad \text{Eqn. (8)}$$

$$G_{min} = G - g \text{ siemens} \quad \text{Eqn. (9)}$$

The voltage across the detector $V_{DET}$ is the voltage that is proportional to responsivity. The detector voltage can be found by subtracting the output voltage $V_{OUT}$ from the power supply voltage $V_{DD}$. Thus, the nominal voltage across the detector is $$V_{DETnom} = V_{DD} - V_{OUT}(t) = V_{DD} e^{-Gt/C} \text{ volts} \quad \text{Eqn. (10)}$$

It follows then, that for the maximum conductance, the time dependent voltage across the detector is $$V_{DETmax} = V_{DD} e^{-(G+g)t/C} \text{ volts} \quad \text{Eqn. (11)}$$

Similarly, the time dependent voltage for the minimum conductance is $$V_{DETmin} = V_{DD} e^{-(G-g)t/C} \text{ volts} \qquad \text{Eqn. (12)}$$

Using the exponential distributive law $$e^{(a+b)x} = e^{ax} e^{bx} \qquad \text{Eqn. (13)}$$

then $$V_{DETmax=VDETnom} e^{-gt/C} \text{ volts} \qquad \text{Eqn. (14)}$$

and $$V_{DETmin=VDETnom} e^{gt/C} \text{ volts} \qquad \text{Eqn. (15)}$$

The following are power series expansions for the exponential functions $e^{-x}$ and $e^x$:

$$e^{-x} = 1 - x + 0.5x^2 - 0.167x^3 + 0.042x^4 - \ldots \qquad \text{Eqn. (16)}$$

$$e^x = 1 + x + 0.5x^2 + 0.167x^3 + 0.042x^4 - \ldots \qquad \text{Eqn. (17)}$$

Using the first order approximation of these exponential functions in the minimum and maximum detector voltages, the following results are obtained:

$$V_{DETmax} = V_{DETnom}(1 - gt/C) \text{ volts} \qquad \text{Eqn. (18)}$$

$$V_{DETmax} = V_{DETnom}(1 + gt/C) \text{ volts} \qquad \text{Eqn. (19)}$$

Clearly, the detector voltage for a detector 17 with maximum conductance is less than the voltage across a detector 17 with minimum conductance. Since the detector's responsivity is proportional to the applied bias, the detectors with lower conductance are biased for higher responsivity, and the detectors with higher conductance are biased for lower responsivity. The nonlinear response of this aspect of the invention thus provides an automatic correction for nonuniformities in the photoconductivity of each single detector element in an array.

An additional advantage of the exemplary embodiment is that the signal to noise ratio of the detector output response is significantly improved. It is understood that, in a conventional detector structure, the injector transistor inherently produces low frequency noise (1/f noise) in the output response. In a conventional photodetector this manifests itself as "flicker" noise in the output imagery that can be detected by the human eye. By not utilizing an injector transistor, and instead directly connecting the detector with the charge well, this low frequency "flicker" noise is eliminated.

Supplying a non-linear bias to the QWIP by providing a direct connection between the charge well capacitance and the detector output, without the presence of any intervening direct injection transistor, additionally provides for compression of the voltage response of the QWIP to high flux targets. Compression of the voltage response further provides an improved dynamic range that permits saturation fluxes of greater than 20,000*NEI. These advantages can be seen qualitatively in FIG. 6. The voltage response curve 600 illustrates the linear response of a detector with the conventional constant bias applied by the direct injection transistor. As can be seen in the Figure, the voltage response of the detector with constant bias is a linear ramp 600 and the response quickly saturates 610 at low ratios of H to $H_o$. With the conventional constant bias across the detector, the only way to avoid saturation is to shorten the integration time of the charge well.

The non-linear bias applied across the detector of the exemplary embodiments of the invention, however, permits the response to reach very high power intensity ratios (H/$H_o$) before saturating (see 620, FIG. 6) by compression of the output response. Compression of the output response thus further permits a greater dynamic range. Compression of the output response and the increased dynamic range that results is demonstrated in the following analysis.

The optically radiated energy ($P_I$) from a remote gray body target is defined by by Planck's black body radiation law. Over a relatively narrow bandpass, the power radiated from the gray body target into a hemisphere can be represented by the following approximation to Planck's black body radiation law:

$$P_I(T) = \frac{\xi A_I 2hc^2 \pi \frac{\lambda_B}{\lambda_P^5}}{e^{hc/(kT\lambda_p)} - 1} \text{ watts} \qquad \text{Eqn. (20)}$$

where $\xi$ is the target emissivity;

$A_I$ is the effective target area in square centimeters;

h is Planck's constant, 6.626E-34 joule*seconds;

c is the velocity of light, 2.9979E10 centimeter per second;

k is Boltzmann's constant, 1.3802E-23 joules per Kelvin;

T is the target's temperature in Kelvin;

$\lambda_B$ is the passband width in centimeters; and $\lambda_p$ is the arithmetic mean of the pass band in centimeters or $$P_I(T) = \frac{P_I}{e^{\frac{T_p}{T}} - 1} \text{ watts} \qquad \text{Eqn. (21)}$$

where $P_{I=\xi A_I} 2hc^2 \pi \lambda_B / \lambda_p^5$ in Watts; and $T_{p=hc/(k\lambda_p)}$ in Kelvin The effective radiated power received at some point from the remote gray body is a function of the distance between that point and the remote gray body. This distance is called the range R. Assuming that the target power $P_I$ is equally distributed over a hemisphere, the power intensity H at some range R from the target is represented by:

$$H(T) = \frac{\alpha_a P_I(T)}{2\pi R^2} \text{ watts/cm}^2 \qquad \text{Eqn. (22)}$$

where $\alpha_a$ is the atmospheric attenuation

Thus, the power intensity H at some range R from the gray body target equals the following:

$$H(T) = \frac{H}{e^{\frac{T_p}{T}} - 1} \text{ watts/cm}^2 \qquad \text{Eqn. (23)}$$

Generally, a circular optical aperture collects the radiated power from the gray body and focuses this power onto the surface of the quantum well infrared detector. The collected power is then:

$$P_o(T) = \alpha A_o H(T) \text{ watts} \qquad \text{Eqn. (24)}$$

where $A_o$ = detector's effective optical area = $\pi d_o^2/4$ cm$^2$; and $\alpha_o$=optical transmission efficiency The collected power incident upon the quantum well detector causes a photo conduction process to occur where, for any given number of photons incident upon the detector, a number of electrons are freed to make their way to the output terminal of the detector. The arrival rate of these electrons at the output terminal represents the photo-current. The flux of the incident photons is related to the collected power by the following relation:

$$Q_p(T) = P_o(T)\frac{\lambda_p}{hc} \text{ photons/seconds} \quad \text{Eqn. (25)}$$

The relationship between the number of incident absorbed photons and the number of released electrons is called the quantum efficiency. For quantum wells, the quantum efficiency is typified by about one electron released for each five impinging photons.

$\eta$=quantum efficiency in electrons/photon≈0.2 electrons/photon

Freed electrons that are moved into the conduction band from the valence band in a quantum well by photon absorption (or thermal energy) stay in the conduction band for an average time called the carrier life time $t_{clf}$. The number of electrons that move into the conduction band as a result of the incident photon flux is:

$$n_o = Q_p(T)\eta \frac{t_{clf}}{L} \quad \text{Eqn. (26)}$$

When an electric field is applied across the quantum well, the carriers $n_o$ that are present in the conduction band move with a velocity to the output terminals of the detector. The ratio of the velocity of the electron to the applied electric field is called mobility u of the electron. The mobility is used to define the photo conductivity $\sigma$ of the active region in the quantum well:

$$\sigma = uqn_o \text{ amp*cm/volt} \quad \text{Eqn. (27)}$$

The conductance G, which takes into account the geometry of the quantum well and the orientation of the applied electric field, is equal to the following:

$$G = A_d \frac{\sigma}{L} \text{ amps/volt} \quad \text{Eqn. (28)}$$

where $A_d$ is the effective detector area in square centimeters.

By substituting Eqns. 23 through 27 into Eqn. 28, the following relationship between the applied power density H(T) and the conductance G is found:

$$G(T) = a_o H(T) \text{ amps/volt} \quad \text{Eqn. (29)}$$

where $$a_o = \frac{A_d uq\eta t_{clf} \alpha A_o \lambda_p}{hcL^2} \quad \text{Eqn. (30)}$$

Eqn. (30)

Eqn. 29 clearly demonstrates that G(T) is proportional to the applied power density H(T). Substituting Eqn. 29 into Eqn. 7 provides the voltage across the quantum well as a function of time t and power intensity H(T):

$$V(t, H) = V_{DD}\left(1 - e^{\frac{-a_o H(T)t}{C}}\right) \quad \text{Eqn. (31)}$$

Eqn. (31)

Therefore, the output voltage as a function of the power intensity, $\tau$ seconds after the Reset Switch is opened, is equal to the following:

$$V(H) = V_{DD}\left(1 - e^{\frac{-H(T)}{H_o}}\right) \quad \text{Eqn. (32)}$$

Eqn. (32)
where $H_o = C/(a_o \tau)$

Eqn. 32 can alternatively be expressed as a function of the conductance G(T):

$$V(G(T)) = V_{DD}\left(1 - e^{\frac{-G(T)\tau}{C_w}}\right) \quad \text{Eqn. (33)}$$

Eqn. (33)

Figure 6:
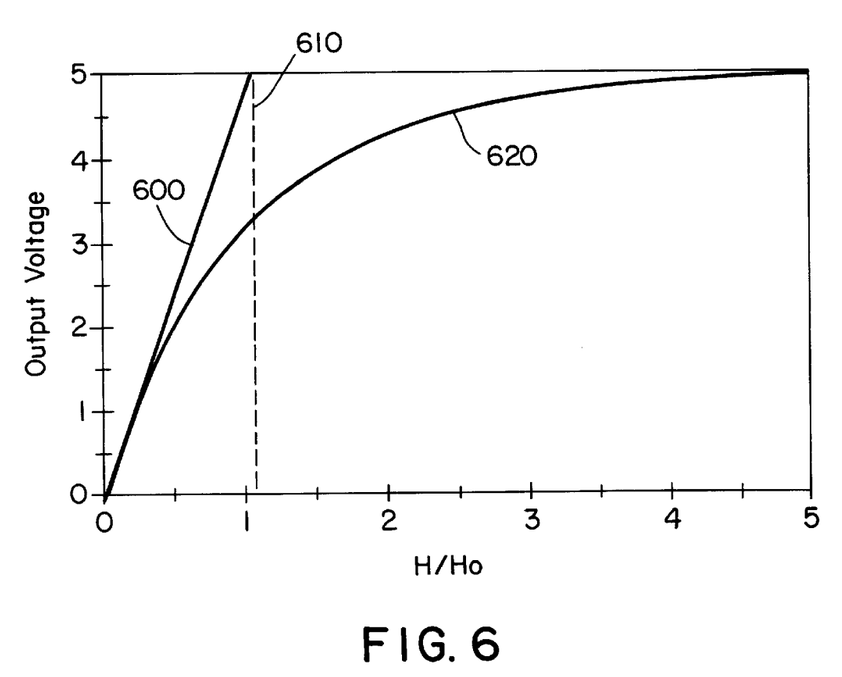
FIG. 6 is an exemplary plot of voltage response curves versus power intensity ratios for fixed and non-linearly biased detectors.

The output voltage response of Eqn. 32 is shown by curve 620 in FIG. 6. As demonstrated by this curve, the output voltage, in contrast to the linear ramp of curve 600, does not saturate at higher power intensity ratios (H/H$_o$). The exponential bias across the quantum well thus compresses the response of the detector to higher incident power intensities. Compression of the response further permits the detector to detect a broader range of incident power intensities. This can be seen, for example, in FIG. 6, where curve 620 demonstrates achievement of H/Ho ratios spanning the broader voltage range of ≈0–5 as compared to curve 600 (conventional constant detector bias) where H/Ho ratios merely span the voltage range of 0–1 before saturation.

The dynamic range of exemplary embodiments of the invention can be analytically demonstrated. Dynamic range DR is defined as the following:

$$DR = \frac{V(G_{Max}) - V(G(T_{BG}))}{v_n(G(T_{BG}))} \quad \text{Eqn. (34)}$$

Eqn. (34)
where V is the output voltage;
  $G_{Max}$ is the detector photo conductance at the maximum expected incident irradiance;
  $G(T_{BG})$ is the detector photo conductance at the background irradiance temperature $T_{BG}$; and
  $v_n(T_{BG})$ is the output noise voltage of the detector at the background irradiance temperature $T_{BG}$.

The dominant source of noise that contributes to the output noise voltage $v_n$ is the generation-recombination noise of the detector. The generation-recombination noise results from the randomness of the number of generated electrons in the conduction band of the detector that reach the detector output electrode without recombining. The generation-recombination noise is traditionally defined as a current $i_n$ in the form $$i_n = (4q\beta i_p f_n)^{0.5} \quad \text{Eqn. (35)}$$

where
  q is the electron charge (1.6*10$^{-19}$ coulombs;
  $\beta$ is the detector photoconductive gain, where $\beta = V\beta o$ with V=the bias voltage and $\beta o$=the photo conductive gain for a bias voltage of one volt;

$i_p$ is the detector current; and
$f_n$ is the noise bandwidth.
Additionally, the detector current $i_p$ is defined as:

$$i_p = VG \qquad \text{Eqn. (36)}$$

and the noise current $i_n$ can further be defined as:

$$i_n = V g_n \qquad \text{Eqn. (37)}$$

where $g_n$ is the incremental noise conductance

Using Eqns 34–36 and solving for $g_n$, the following result is found:

$$g_n = (4q\beta_o G f_n)^{0.5} \qquad \text{Eqn. (38)}$$

where the integration time determines the noise bandwidth, $f_n = 1/2\tau$. The incremental noise conductance ($g_n$) represents the incremental value from integration to integration cycle. To further find the equivalent output noise voltage $v_n$, an incremental analysis of the output voltage $V(G)$ (Eqn. (33) above) can be achieved by taking the derivative with respect to the photo conductance $$\frac{\partial V(G)}{\partial G} = \frac{V_{DD}\tau}{C_w} e^{\frac{-G\tau}{C_w}} \qquad \text{Eqn. (39)}$$

Eqn. (39) and setting the incremental noise conductance $g_n$ equal to the delta of the photo conductance $\partial G_p$. The delta of the voltage $\partial V(G)$ then defines the output noise voltage $v_n$ as measured across the charge well capacitor:

$$v_n = \frac{g_n V_{DD}\tau}{C_w} e^{\frac{-G\tau}{C_w}} \qquad \text{Eqn. (40)}$$

Eqn. (40)
Thus, for any given $G_{Max}$ and $T_{BG}$, the dynamic range of Eqn. 34 can be calculated using Eqns. 33 and 40.

As one example, consider a red spike system where the integration time is five milliseconds and the photo conductance is calculated as:

$$G(T) = \frac{G}{e^{\frac{T_p}{T}} - 1} = \frac{220 * 10^{-9}}{e^{\frac{3000}{T}} - 1} \qquad \text{Eqn. (41)}$$

Eqn. (41)
For this hypothetical system, let the background or target temperature be 300 Kelvin. The photo conductance at this temperature is therefore:

$$G(300) = 10^{-11} \qquad \text{Eqn. (42)}$$

Using a 500 femtofarad capacitor and a 5 volts power supply, the output voltage can be determined using Eqn. (33):

$$v_o(G(300)) = 5(1 - \exp(-5E-3*1E-11/5E-13)) = 0.476 \text{ volts} \qquad \text{Eqn. (43)}$$

The incremental noise conductance $g_n$ and the output noise voltage $v_n$ can further be calculated using Eqns. 38 and 40:

$$g_n(300) = (4*1.6E-19*0.1*1E-11*100)^{(-0.5)} = 8*10^{-15} \text{ amp/volt} \qquad (44)$$

$$v_n(300) = (8E-15*5*5E-3/5E-13)*\exp(-0.1) = 362 \text{ micro volt rms} \qquad (45)$$

The signal to noise ratio is thus 1,315:1 or 62.4 decibels.

Now assume that this hypothetical system must observe a signal that is 20,000 times the noise equivalent conductance. The system must therefore accomodate a signal that is 20,000 times larger than the noise equivalent irradiance (NEI):

$$G_{max} = 2E4 * g_n(300) = 160 * 10^{-12} \text{ amp/volt} \qquad \text{Eqn. (46)}$$

The output voltage is found from:

$$v_o(G_{Max}) = 5(1-\exp(-5E-3*16E-11/5E-13)) = 5(1-\exp(-1.6)) = 3.99 \text{ volts} \qquad \text{Eqn. (47)}$$

Using Eqn. (34), the dynamic range of this hypothetical system can then be calculated:

$$DR = \qquad \text{Eqn. (48)}$$

$$\frac{v_o(G_{Max}) - v_o(G_p(300))}{v_n(300)} = \frac{3.99 - 0.475}{362E-6} = 9,709 = 79.74 \text{ dBs}$$

Eqn. (48)

This result thus analytically demonstrates the improved dynamic range of exemplary embodiments of the invention that results from the compression of the response of the detector to high flux targets. Through provision of a dynamic bias voltage across the photodetector as describe above, the photodetector of the exemplary embodiments of the invention can resolve a first quantity of received radiation, and a second subsequently received quantity of received radiation that is substantially greater than said first quantity of received radiation, without saturating the output response of the photodetector.

Figure 7:
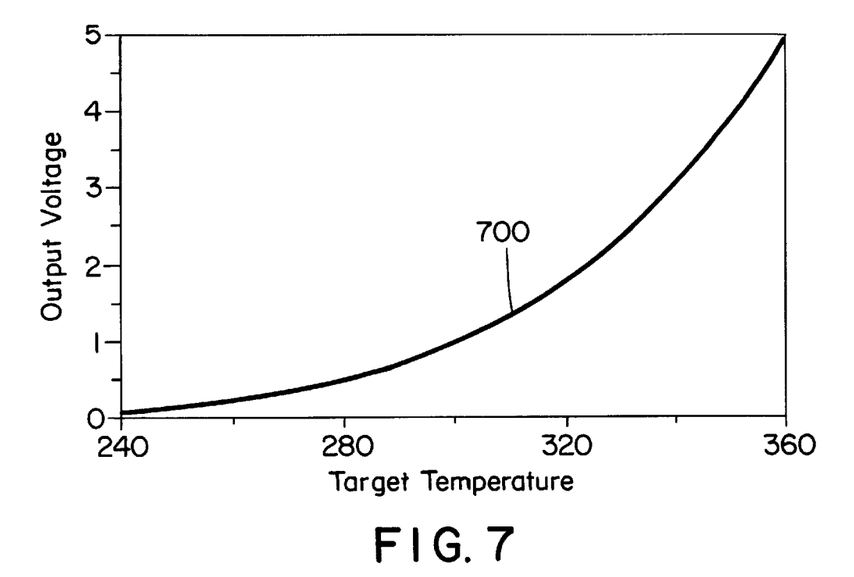
FIG. 7 is an exemplary plot of the voltage response curve versus target temperature for a fixed bias detector.
Figure 8:
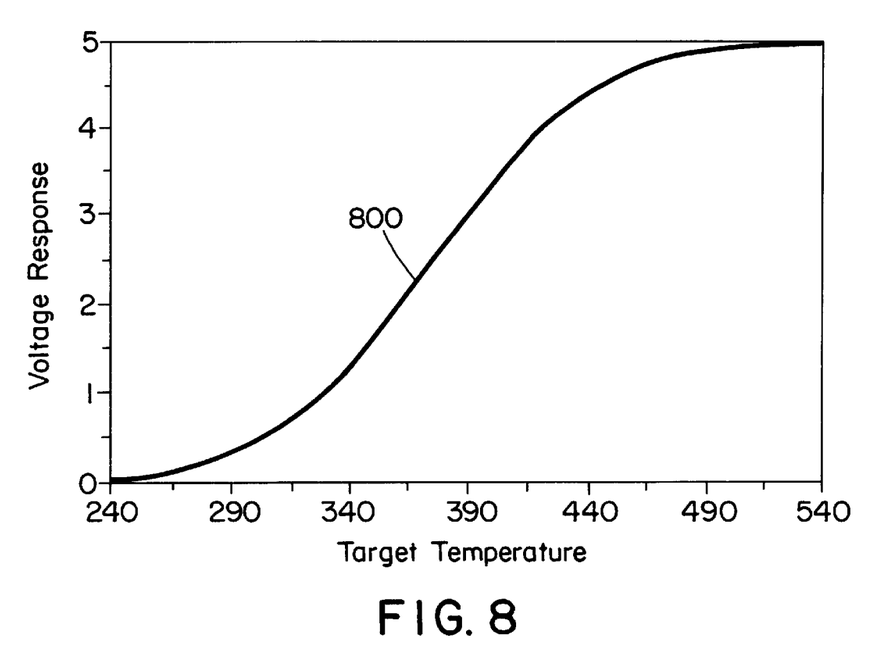
FIG. 8 is an exemplary plot of the voltage response curve versus target temperature for a non-linearly biased detector.

The dynamic bias across the detector additionally has the advantage of providing a more linear thermal response. A conventional constant bias detector provides an output voltage response that is non-linear with respect to target temperature as shown by curve 700 of FIG. 7. In contrast to this non-linear curve, one example of a voltage response curve 800 of the present invention is shown in FIG. 8. As can be seen in the Figure, the output voltage is approximately linear over a range of temperatures (≈300 Kelvin to ≈400 Kelvin).

Operation of a 640×480 FPA using the techniques of this aspect of the invention has been successfully demonstrated and one positive effect of this technique is that 'hot' pixels (high response detectors) are compressed, resulting in a more uniform image with fewer replaced pixels. This technique also compresses the compounded $\cosine^4(\theta)$ function. The dynamic bias mode produced very good imagery compared with the normal, fixed bias mode.

It is noted that the advantages produced by operation of a FPA using the techniques of this aspect of the invention are contrary to the expectations of one having ordinary skill in the art. That is, conventional thinking in the art would anticipate that the nonlinear biasing of the detector, resulting from elimination of the injector transistor from the ROIC unit cell, would create pattern noise in the detector output signal. However, operation of a photodetector without inclusion of the injector transistor has demonstrated that this is not the case. The nonlinearity of the bias does not produce the expected pattern noise because the bias, though nonlinear in time, is a linear function of the detector conductance. Thus, even with an applied dynamic bias, any variation in detector conductivity produces a corresponding linear change in the output voltage response. The nonlinear bias additionally has the advantage, as discussed previously, of providing correction for nonuniformities in the detector. Thus, the advantages produced by providing a dynamic, rather than fixed bias of the detectors in a FPA would not be intuitively apparent to one having ordinary skill in the art.

As a solution to the problem of limited charge well size and limited array density, another aspect of the present invention relocates the charge well from the unit cell to the physically separate detector structure. With the charge well removed from the ROIC unit cell, the unit cell contains only the necessary active components such as switches, storage well, output buffer, and row switch. Relocation of the relatively large charge well therefore permits a reduction in area of the unit cell which, correspondingly, enables a reduction in pitch of the associated detector. This reduction in detector pitch thus advantageously permits a higher density array configuration which can approach that of a very high density array of greater than 856×480. Further, fabrication of the charge well in the detector beneficially permits construction of larger integration charge wells.

Figure 3:
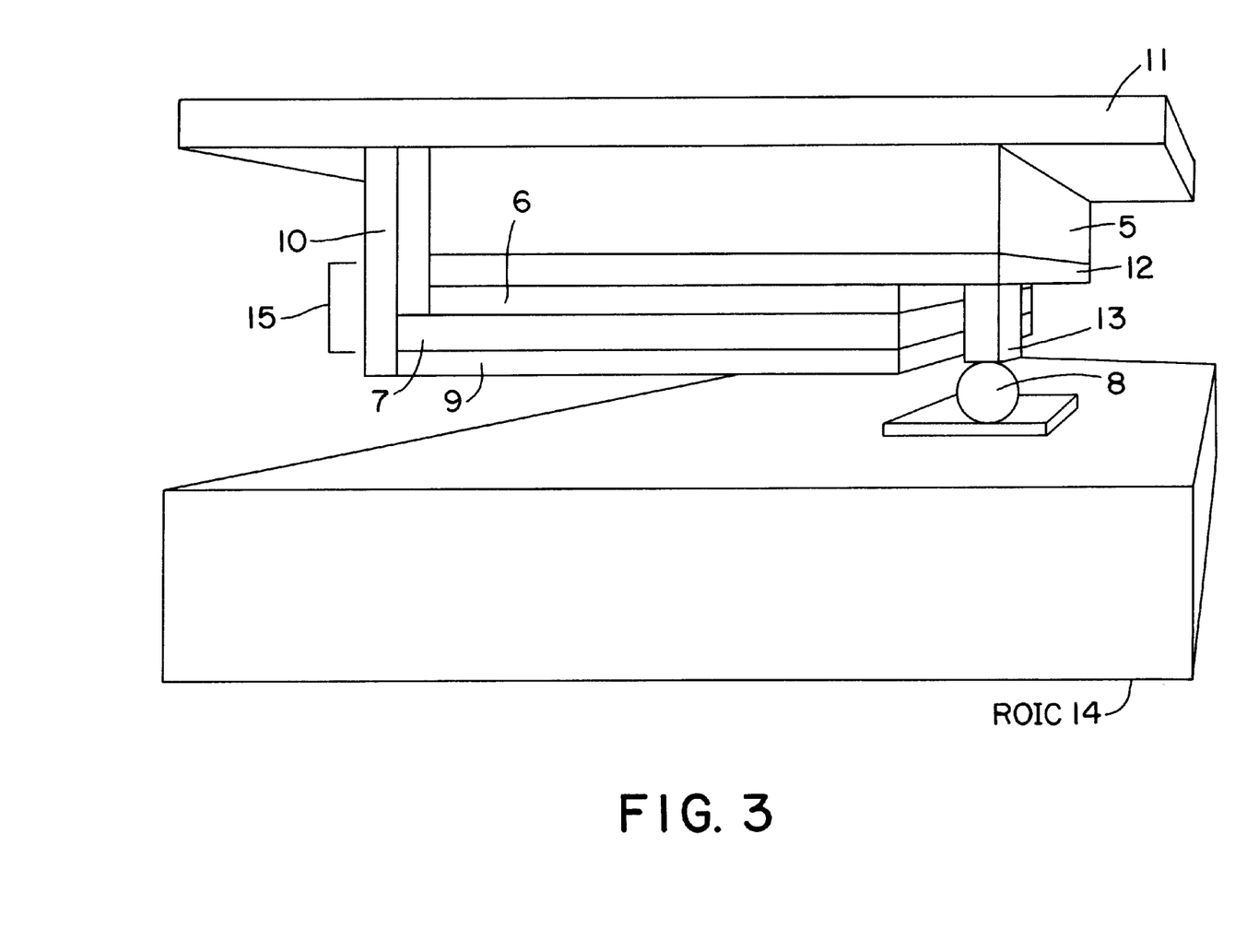
FIG. 3 is a structural diagram of a quantum well detector with integral charge well.

As shown in FIG. 3, an exemplary structure is provided wherein the integration charge well is fabricated in the detector and not the ROIC unit cell. This is accomplished by either growing or depositing a suitable dielectric 6, a secondary contact layer 7, and an interface bump 8 onto a QWIP detector 5. A number of compounds can be used for the dielectric 6 including SiO, $SiO_2$, ZnS, and $MgF_2$. However, a better dielectric is GaAs, which is already an inherent element in the fabrication of a conventional GaAs/AlGaAs Quantum Well detector. The GaAs dielectric consists of an undoped epitaxially grown GaAs layer. The same Molecular Beam Epitaxy (MBE) growth process used to construct the Quantum Well detector structure may be used to produce the dielectric layer. This process produces a very accurate and uniform dielectric layer in addition to providing the benefit of being a grown, instead of a deposited, layer.

As a representative example, a 50 Angstrom undoped GaAs dielectric would produce a capacitance per unit area in a charge well of 23 femtoFarads per square micron. For the 22 $\mu$m×22 $\mu$m active area in a 640×480 detector, this results in a charge well capacitance of over 1.1 picoFarads. In contrast, the prior art 640×480 ROIC unit cell has a 340 femtoFarad charge well capacitance.

Referring back to the exemplary embodiment of the charge well illustrated in FIG. 3, the common contact layer 11 is formed over a multiple quantum well detector 5 which further overlays a doped GaAs top contact layer 12. The combination of the contact layer 12 with two subsequent layers, an undoped GaAs dielectric layer 6 and a doped GaAs bottom contact layer 7, forms the integral charge well capacitance 15. The bottom layer 7 of the charge well further overlays a metal contact layer 9. Both layers 7 and 9 are connected by a metal via 10 back to the doped GaAs common contact layer 11. An indium bump 8 is connected through a metal post 13 to the top doped GaAs contact layer 12. As shown in FIG. 3, the indium bump 8 provides the electrical connection to the underlying ROIC unit cell structure 14.

Figure 4:
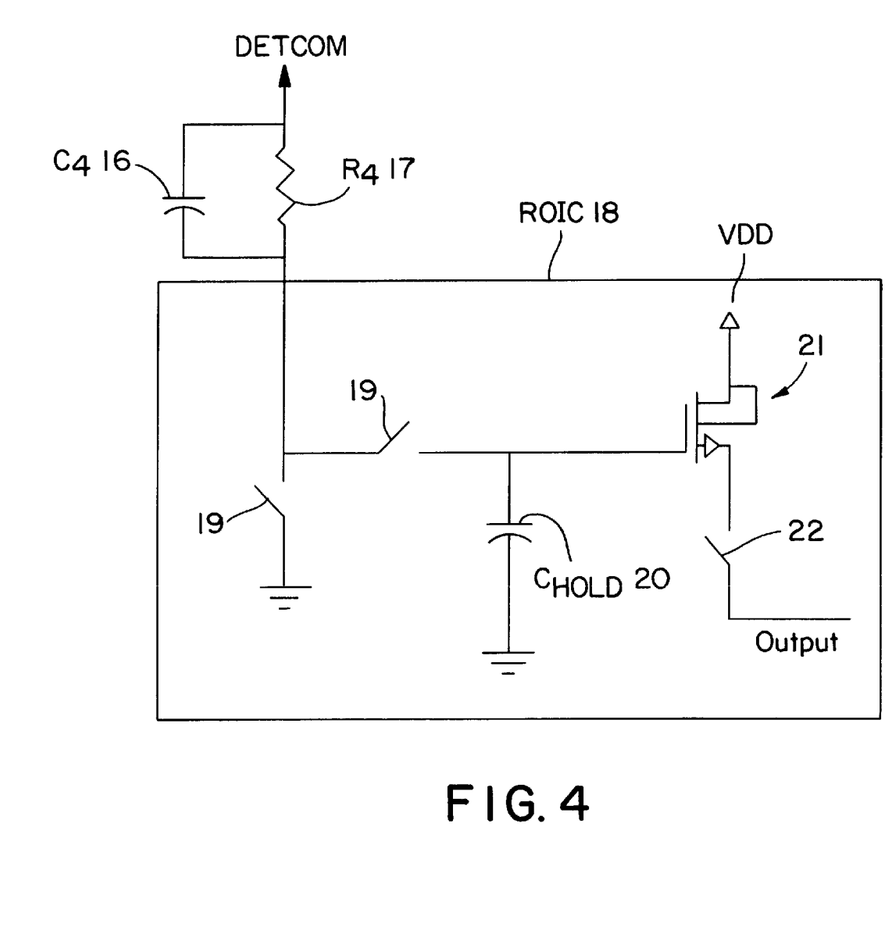
FIG. 4 is a simplified schematic diagram of the integral charge well detector and ROIC in accordance with an aspect of the present invention.

A simplified schematic diagram of the integral charge well detector and the ROIC unit cell output element (also referred to throughout the disclosure simply as "output element") of FIG. 3 is shown in FIG. 4. The combination 16 of the detector capacitance and integral charge well capacitance 15 is represented by $C_d$. $R_d$ represents the simplified detector resistance 17. A separate ROIC unit cell 18 has interconnected switches 19, storage well capacitance $C_{hold}$ 20, output buffer 21, and output row switch 22. The voltage response across the detector in the dynamic bias mode is:

$$v(t) = V_{DETcom}\left[1 - e^{\left(\frac{-t}{R_d C_d}\right)}\right]$$ Eqn. (49)

Eqn. (49) for a fixed integration time, $\tau_i$, this becomes $$v(\tau_i, T) =$$ Eqn. (50)

$$V_{DETcom}\left[1 - e^{\left(\frac{-\tau_i}{R_d C_d}\right)}\right] = V_{DETcom}\left[1 - e^{\frac{-\tau_i \tau_c \mu_c K_p e^{\left(\frac{-T_p}{T}\right)}}{t_d^2 C_d}}\right]$$

Eqn. (50)

Figure 5A:
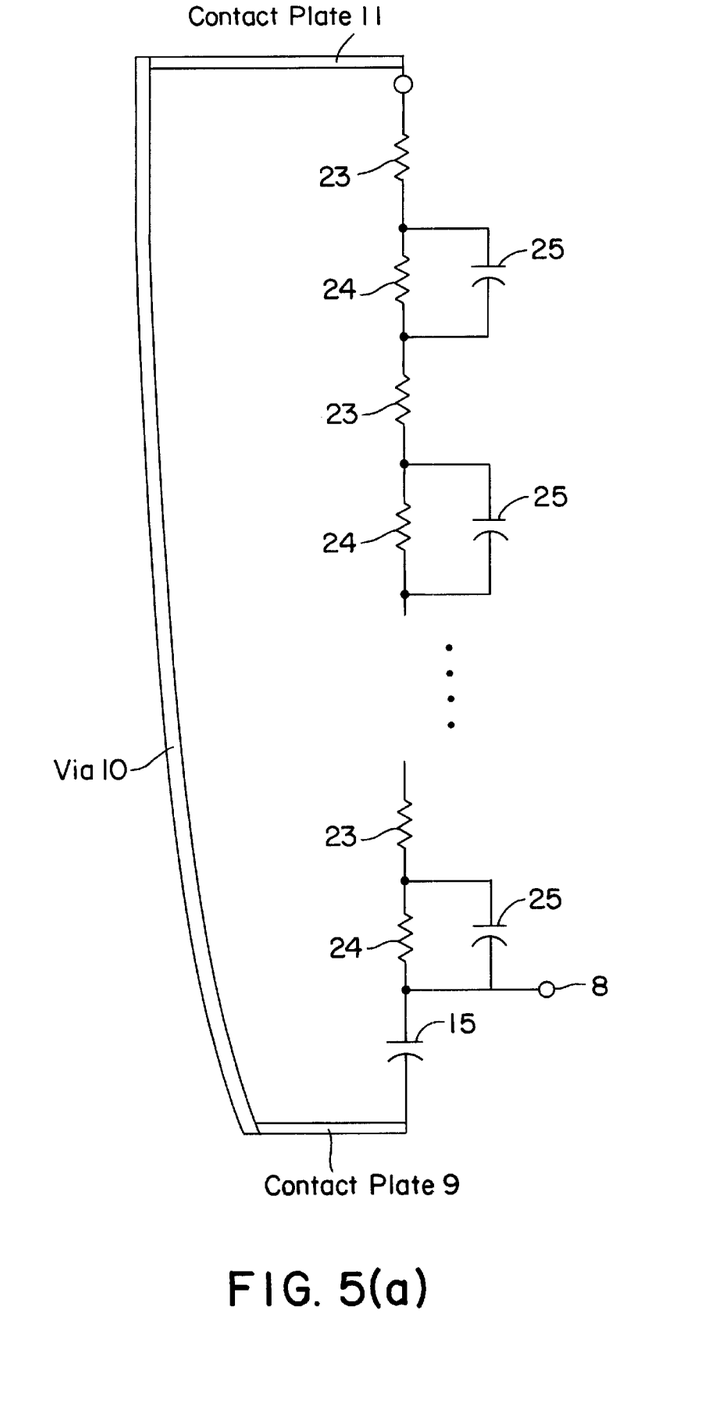
FIG. 5(a) is an expanded schematic diagram of the multiple quantum well detector with integral charge well.

An expanded schematic diagram of the simplified detector elements ($C_d$ and $R_d$) of FIG. 4 is further shown in FIG. 5(a). Here, the details of the Multiple Quantum Well detector with integral charge well 5 are demonstrated. The multiple quantum wells are modeled as alternating quantum well resistances 23 in series with a parallel combination of barrier resistances 24 and barrier capacitances 25. The charge well capacitance, physically configured in FIG. 3 as the undoped GaAs dielectric Layer 6 sandwiched between the doped GaAs contact layers 7 and 12, is shown as the charge well capacitance 15. The charge well capacitance 15 is connected by the contact plate 9 through the via 10 to the contact plate 11. Also shown is the indium bump 8 electrically connected to the multiple quantum well detector.

In summary, an improved quantum well infrared photodetector structure that has significant advantages over the prior art has been described. By removing the prior art injection transistor from the ROIC, a direct connection between the charge well and the detector output is provided. This direct connection enables the voltage across the charge well to be used as a dynamic bias voltage for the detector. Dynamic biasing of the detector beneficially results in automatic response correction and a reduction in low frequency noise. Elimination of the need for an injection transistor further enables the relocation of the charge well from the ROIC. Without the need for an intervening injection transistor between the detector output and the charge well, it becomes feasible to relocate the charge well from the ROIC onto the detector structure. This relocation advantageously makes possible the fabrication of larger charge wells and higher density arrays.

Although a number of embodiments are described herein for purposes of illustration, these embodiments are not meant to be limiting. Those of ordinary skill in the art will recognize modifications that can be made in the illustrated embodiment. Such modifications are meant to be covered by the spirit and scope of the appended claims. For example, fabrication of the integration charge well in the Quantum Well Infrared Photo detector array may be equally applied to any size integrating infrared detector array.

What is claimed is:

1. A method of detecting radiation comprising the steps of:

receiving the radiation in a detector structure;

converting the received radiation into moving charges;

supplying some portion of the moving charges to a charge well over a first time interval; and dynamically biasing said detector structure over said first time interval using a voltage derived from said supplied charges.

2. The method of claim 1, wherein said dynamic bias prevents saturation of a voltage response of said detector structure at high intensity levels of said received radiation.

3. The method of claim 1, wherein said dynamic bias induces a voltage response of said detector structure that is linear with respect to a range of temperatures associated with said received radiation.

4. A method of detecting radiation comprising the steps of:
- receiving the radiation in a detector structure;
- converting the received radiation into moving charges;
- storing some portion of the moving charges in a charge well; and
- using said stored charges, preventing a voltage response of said detector structure from saturating at high intensity levels of said received radiation.

5. A method of detecting radiation received at a photodetector comprising the steps of:
- receiving a first quantity of radiation at the photodetector;
- receiving a second quantity of radiation at the photodetector, wherein the second quantity of radiation is substantially greater than the first quantity of radiation; and
- providing a dynamic bias voltage across the photodetector during the step of receiving the second quantity of radiation, wherein the dynamic bias voltage is based on the first quantity of radiation and at least part of the second quantity of radiation.

* * * * *